United States Patent [19]
Liu et al.

[11] Patent Number: 5,612,914
[45] Date of Patent: Mar. 18, 1997

[54] ASYMMETRICAL NON-VOLATILE MEMORY CELL, ARRAYS AND METHODS FOR FABRICATING SAME

[75] Inventors: David K. Liu; Man Wong, both of Dallas, Tex.

[73] Assignee: Texas Instruments Incorporated, Dallas, Tex.

[21] Appl. No.: 1,004

[22] Filed: Jan. 6, 1993

Related U.S. Application Data

[62] Division of Ser. No. 723,700, Jun. 25, 1991, Pat. No. 5,202,576.

[51] Int. Cl.$^6$ ............................................. G11C 13/00
[52] U.S. Cl. ..................... 365/185.26; 365/185.14; 257/315; 257/344
[58] Field of Search ................. 365/185.14, 185.26; 257/315, 344

[56] References Cited

U.S. PATENT DOCUMENTS

| | | | |
|---|---|---|---|
| 4,652,897 | 3/1987 | Okuyama et al. | 357/23.5 |
| 4,821,236 | 4/1989 | Hayashi et al. | 365/185 |
| 4,835,740 | 5/1989 | Sato | 365/185 |
| 4,939,558 | 7/1990 | Smayling et al. | 357/23.5 |
| 5,053,841 | 10/1991 | Miyakawa et al. | 357/23.5 |

FOREIGN PATENT DOCUMENTS

| | | |
|---|---|---|
| 0273728 | 7/1988 | European Pat. Off. . |
| 0331418 | 9/1989 | European Pat. Off. . |
| 59-229874 | 12/1984 | Japan . |
| 174095 | 12/1991 | Taiwan . |

OTHER PUBLICATIONS

D. L. Geriach et al., "Reliability Failure Mechanisms", 1990 International Electron Devices and Materials Symposium, Nov. 14–16, 1990, pp. 273–280.

*Primary Examiner*—Do Hyun Yoo
*Attorney, Agent, or Firm*—Ira S. Matsil; W. James Brady, III; Richard L. Donaldson

[57] ABSTRACT

A non-volatile memory cell (10) is formed in the face of a layer of semiconductor (12) of a first conductivity type, and includes a first heavily doped diffused region (14) and a second heavily doped diffused region (16) formed in semiconductor layer (12) to be of a second conductivity type opposite the first conductivity type. First heavily doped diffused region (14) and second heavily doped diffused region (16) are spaced by a channel area (18). A first lightly doped diffused region (20) is formed adjacent first heavily doped diffused region (14) to be of the second conductivity type. A second lightly doped diffused region (22) is formed in semiconductor layer (12) adjacent second heavily doped diffused region (16) to be of the second conductivity type. A floating gate (24) insulatively overlies the channel area and insulatively overlies a selected one of lightly doped diffused regions (20,22). A control gate (30) insulatively overlies floating gate (24).

3 Claims, 3 Drawing Sheets

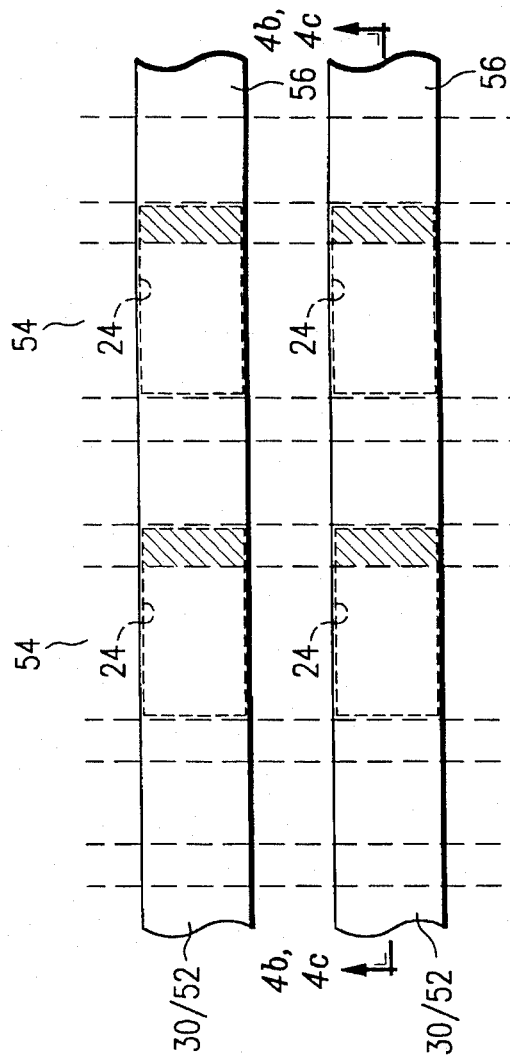
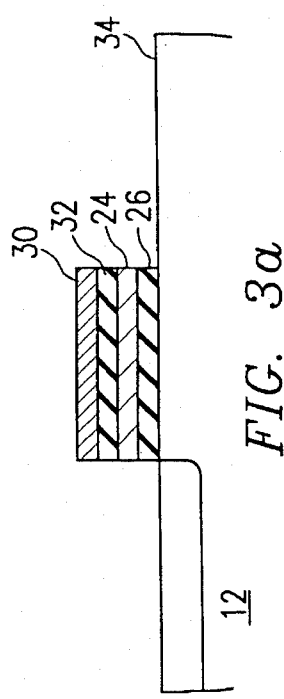
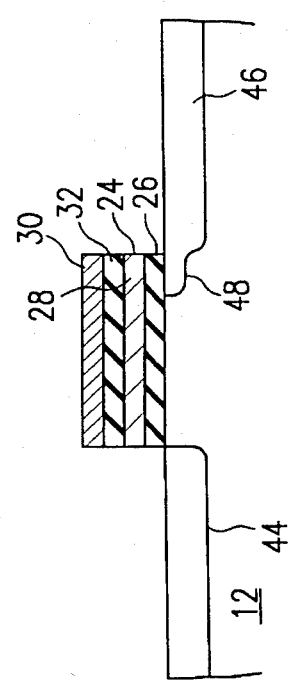
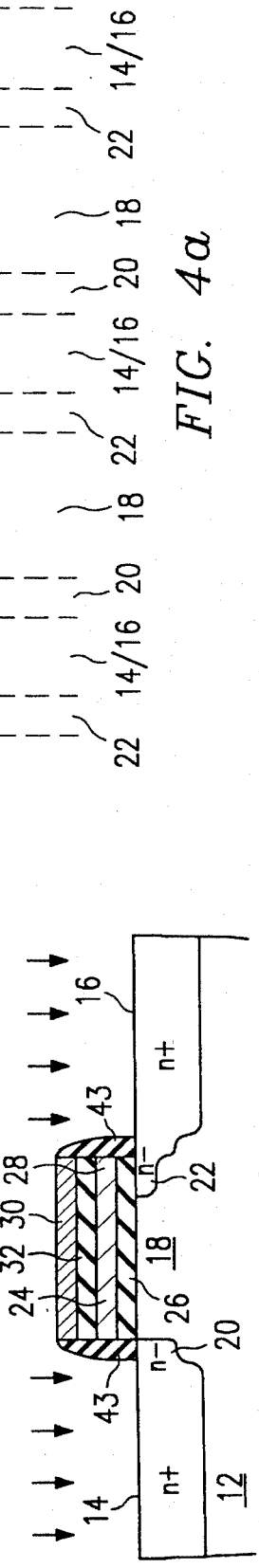

ASYMMETRICAL NON-VOLATILE MEMORY CELL, ARRAYS AND METHODS FOR FABRICATING SAME

This is a division of application Ser. No. 07/723,700, filed Jun. 25, 1991, now U.S. Pat. No. 5,202,576 issued Apr. 13, 1993.

TECHNICAL FIELD OF THE INVENTION

The present invention relates in general to non-volatile memory cells and more particularly to asymmetrical non-volatile memory cells, arrays made of such cells, and methods for its fabrication.

BACKGROUND OF THE INVENTION

Electrically-programmable, read-only memories (EPROMs) and electrically-programmable, electrically-erasable read-only memories (EEPROMs) are non-volatile semiconductor memory devices based on metal oxide semiconductor field effect transistors (MOSFETs). EPROM and EEPROM cells store a bit of information as a quantity of electrons on a floating gate structure insulatively formed between the channel and the control gate of the field effect transistor. A charged floating gate raises the threshold voltage of the field effect transistor channel above the voltage normally applied to the control gate during the read operation such that the transistor remains shut off when read voltages are applied to the gate, source and the drain, thereby returning a logic "zero." An uncharged floating gate does not alter the threshold voltage of the channel of the field effect transistor, and therefore a normal gate reading voltage will exceed the threshold voltage, turning on the transistor when read voltages are applied to the gate, source and the drain, and thereby returning a logic "one."

One structure used in EPROM cells and some EEPROM cells is the floating gate avalanche injection metal oxide semiconductor (FAMOS) structure. In this structure, the floating gate is charged by avalanche injection, commonly referred to as "hot electron injection". The majority of the electrons are normally injected to the floating gate from the channel near the drain region of the cell. This process, known in the art as "drain side injection," is a function of the voltages applied to the source and the drain regions and to the control gate, the source being held at a voltage lower than that applied to the drain during programming.

In drain side electron injection, the source is normally grounded or held close to zero volts while the drain is pulsed with a positive voltage. Application of a relatively high voltage pulse to the control gate induces an inversion layer in the channel area of the semiconductor between the source and the drain, allowing electrons to flow from the source to the drain. Due to the interaction between the electric field across the gate oxide created by the voltage applied to the control gate and the electric field in the channel created by the voltage applied to the drain region, the inversion layer near the drain is reduced in depth or "pinched-off." In this "pinch-off" region the electric field is enhanced and the electrons are accelerated towards the drain. A number of these accelerated electrons collide with the semiconductor lattice in the channel, creating electron-hole pairs. An avalanche effect results as the newly created electrons are themselves accelerated through the pinch-off region causing more collisions with the lattice. Some of the electrons created during this process ("hot" electrons) have a sufficient energy level to jump over the potential barrier created by the insulator between the floating gate and the channel. A percentage of these "hot" electrons will in turn be drawn to the floating gate because of the voltage induced on it by capacitive coupling with the control gate. These electrons come to reside on the floating gate, thereby charging it.

Conventional drain side electron injection has serious drawbacks. To simultaneously generate hot electrons and achieve sufficient gate current requires that the drain voltage and the gate voltage both be high. Drain side electron injection biasing does not favor this condition. Further, undesired charging of the floating gate can occur anytime a voltage is applied to the drain, such as when the drain is part of a bitline in an array of memory cells. These disadvantages can be eliminated if the injection of electrons can be moved towards the source side of the channel, and if electric field on the drain side can be reduced during normal read and write bias condition, for the same conventional application of voltages.

Further, if the hot electron injection can be moved to the source side of the cell, a much more significant gate current can be realized since the electric field across the gate oxide near the source, as created by the voltage difference between the grounded source and the control gate is at a maximum. Those electrons resulting from the collision/avalanche process have a high probability of being injected to the floating gate due to the high electric field. This make a 5-V only non-volatile memory device possible. Additionally, erase times can be decreased if the floating gate overlap of the drain is increased and the electric field near the drain is decreased.

Thus a need has arisen for a nonvolatile memory cell using hot electron injection programming in which the injection process has been moved towards the source area, and in which the maximum electric field on the drain side can be reduced. Such a device will take advantage of the maximum electric field available for a given control gate voltage which will ultimately allow for a reduction in control gate voltage actually required. The cell will also eliminate problems resulting from unwanted injection of electrons onto the floating gate when a voltage is applied to the drain, such as when the drain is formed as part of a bitline for a column of cells in a memory array.

SUMMARY OF THE INVENTION

According to the invention, a non-volatile memory cell is formed in the face of a layer of semiconductor of a first conductivity type, and includes first and second highly-doped diffused regions formed in the semiconductor layer to be of a second conductivity type opposite the first conductivity type. The first and second heavily doped diffused regions are spaced by a channel area. A lightly doped diffused region is formed adjacent the second heavily doped diffused region to be of the second conductivity type. A floating gate insulatively overlies the channel area and the lightly doped diffused region. A floating gate is capacitively coupled to the control gate.

According to other aspects of the invention, a method for fabricating an asymmetrical non-volatile memory cell at a face of a layer of semiconductor of a first conductivity type is provided. A first layer of conductor is formed insulatively adjacent the layer of semiconductor followed by the formation of a second layer of conductor insulatively adjacent the first layer of conductor. Next, an etch is performed to define a stack including a floating gate conductor insulatively adjacent a channel area of the semiconductor and a control gate conductor insulatively adjacent the floating gate conductor, the stack being formed so as to have edges bordered by respective source and drain areas of the layer of semiconductor. First and second lightly doped diffused regions are formed in the respective source and drain areas to be of a second conductivity type opposite the first conductivity type by an implant into the face of the layer of semiconductor at a substantially perpendicular angle thereto. The first and second lightly doped diffused regions are thus formed to be in alignment with the edges of the stack. A third lightly doped diffused region of the second conductivity type is formed in the drain area by an implant into the face of the semiconductor at a non-perpendicular angle thereto. The third lightly diffused region thus extends under an adjacent edge of the stack. Sidewall insulators are then formed on the edges of the stack followed by the implantation of a heavily doped source region in the source area, and a heavily doped drain region in the drain area. The source and drain regions are formed to be of the second conductivity type.

The present invention presents distinct advantages over prior art non-volatile memory cells. The present invention employs hot electron injection closer to the source side of the cell, taking advantage of the maximum electric field found adjacent the source region when the source is grounded and a voltage is applied to the control gate. This will allow more efficient programming for a given control gate voltage, or in the alternative, a reduction in the control gate voltage and the drain voltage actually required. By moving the programming towards the source side of the cell by including a lightly doped region on the drain side that is overlapped by the floating gate, problems resulting from unwanted injection of electrons onto the floating gate when a voltage is applied to the drain, such as when the drain is formed as part of a bitline for a column of cells in a memory array, are eliminated. Such a cell with a lightly doped region under a portion of the floating gate in the drain region would significantly reduce the electric field in the drain region during read operation, thus enhancing immunity to bitline stress and read disturb. Finally, such a cell would have increased lifetime since the injection does not occur in the pinch-off area normally used for programming in drain side injection which results in a high concentration of electrons crossing the gate oxide through a small area.

BRIEF DESCRIPTION OF THE DRAWINGS

Other aspects of the invention and their advantages will be discerned when one refers to the following detailed description as taken in conjunction with the drawings, in which like numbers identify like parts and in which:

FIGS. 3a–c show a series of fabrication steps in a second preferred method of fabricating an asymmetrical non-volatile memory cell according to the invention; and FIGS. 4a–c are respective plan and elevational sectional views of an array of asymmetrical non-volatile memory cells according to the invention.

DETAILED DESCRIPTION OF THE INVENTION

The structure and fabrication of an asymmetrical electrically-erasable, read-only memory cell will be described first, followed by a description of the operation of such a cell.

Figure 1:
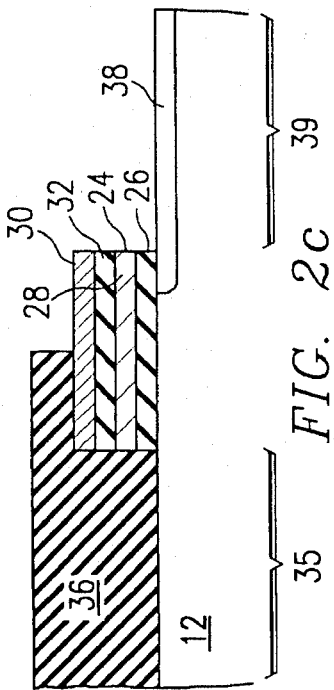
FIG. 1 is a schematic elevational sectional view of an asymmetrical non-volatile memory cell according to the invention.

Referring first to FIG. 1, a schematic cross-sectional elevational view of a non-volatile memory cell according to the invention is shown generally at 10. Memory cell 10 is formed in a p-type semiconductor layer 12, and includes a heavily doped n+ source region 14 and a heavily doped n+ drain region 16 separated by a channel area 18. A first lightly doped diffused region (n–) 20 is formed adjacent source region 14, while a second lightly doped diffused region (n–) 22 is formed adjacent drain region 16. In a preferred embodiment, lightly doped diffused region 20 has a lower dopant concentration than lightly doped diffusion region 22, as discussed below.

A floating gate 24 is separated from channel area 18 by a gate oxide layer 26. A terminal of floating gate 24 is insulatively disposed adjacent lightly doped diffused region 22 adjacent drain region 16. A control gate 30 is formed over floating gate 24, and separated therefrom by an interlevel oxide 32. Sidewall insulators 43 are disposed at the ends of floating gate conductor 24 and control gate conductor 30.

Memory cell 10 is generally referred to as an n-channel device; however, the present invention is not limited to n-channel non-volatile memories. For example, a p-channel device in which semiconductor layer 12 is n-type material, and source region 14, drain region 16, first lightly doped diffused region 20 and second lightly doped diffused region 22 are p-type material, may optionally be used. In the case of a p-channel device, the polarity of the voltages used during the programming, erasing and reading operations will be appropriately inverted as well understood in the art.

Figure 2A:
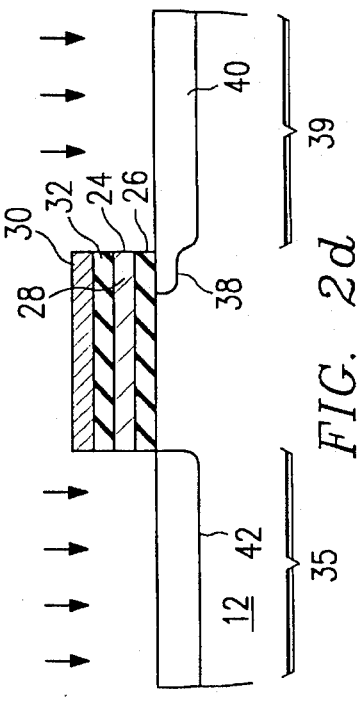
FIGS. 2a–e depict a first preferred method of fabricating an asymmetrical non-volatile memory cell according to the invention.

FIGS. 2a–e are a series of elevational sectional views depicting the steps of a first preferred method of fabricating memory cell 10. FIG. 2a depicts surface 34 of p– semiconductor layer 12 following initial preparation by formation of the layers of material required for the formation of memory cell 10. Gate oxide layer 26 has been grown or deposited to a thickness of between 100 and 200Å across surface 34 of semiconductor layer 12. Next, a first polycrystalline silicon layer is deposited to a thickness of between 3000 and 4000Å. Polycrystalline layer 24 (also known as the poly one layer) is highly doped to render it conductive, and later will be etched to define floating gate 24. An interlevel insulator layer 32 has been deposited across poly one layer 24, and may be, for example, a layer of oxide/nitride/oxide of a thickness between 150 and 500Å. Finally, a second layer 30 of polycrystalline silicon (also known as the "poly two" layer) is deposited to a thickness of between 3000 and 4500Å and highly doped to render it conductive. Following patterning and etching, poly two layer 30 will become control gate 30.

Figure 2B:
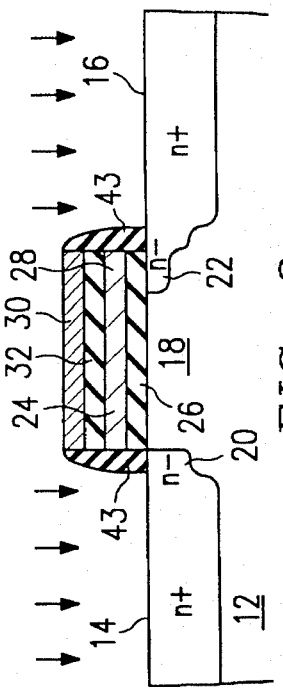

Referring next to FIG. 2b, an anisotropic stack etch has been performed to define a floating gate 24 separated from semiconductor layer 12 by gate oxide 26 and a control gate 30 separated from floating gate 24 by an interlevel insulator layer 32.

Figure 2C:
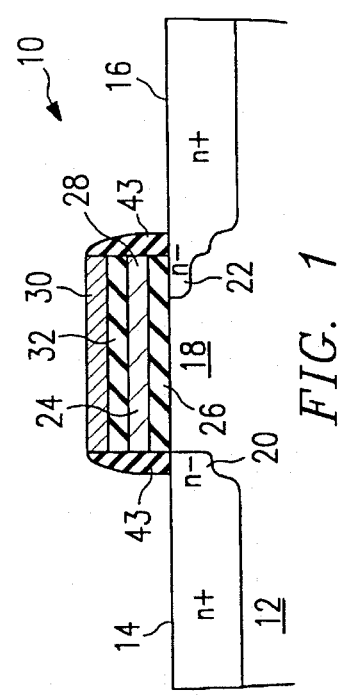

In FIG. 2c, a source side 35 of memory cell 10 has been masked by a layer 36 of photoresist. Next, a lightly doped diffused region 38 is formed in the drain side 39 using the edge of the stack for alignment. The implant may be for example a phosphorus implant at a dose of $1-2\times10^{13}$ cm$^{-2}$ and at an energy of 50 to 70 KeV. Diffusion region 38 is then "driven" under the edge of floating gate 24 by exposure to a temperature of about 900° and 1000° C. for about an hour.

Figure 2D:
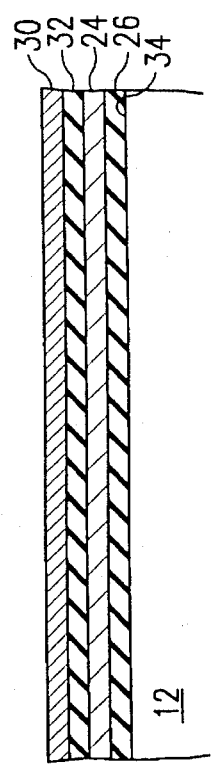

In FIG. 2d, photoresist mask 36 has been removed. A lightly doped diffusion region 40 is performed in the source side 35 of memory cell 10, while a second lightly doped diffusion region 42 has been performed in the drain side 39 of memory cell 10. Diffused regions 40 and 42 may be formed, for example, by phosphorus implants at doses between $1\times10^{12}$ and $1\times10^{13}$ cm$^{-2}$ at energies of between 50 to 70 KeV.

Figure 2E:
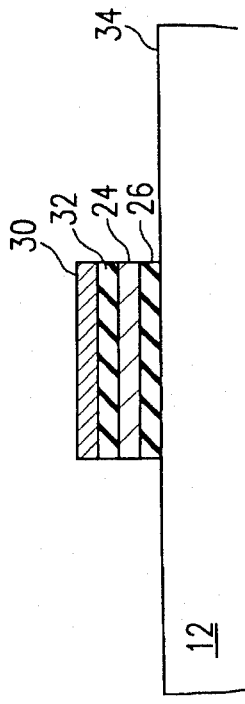

Referring next to FIG. 2e, sidewall insulators 43 have been formed by a conventional method, for example, by the growth or deposition-and-etchback of oxide. This is followed by the formation of heavily doped source region 14 and drain region 16. These may be formed, for example, by an arsenic implant at a dose of approximately $5\times10^{13}$ cm$^{-2}$ and at an energy of 50 to 70 KeV. Following this step, the final profile of memory cell 10 is achieved. Heavily doped (n+) source region 14 has been formed which has a lightly doped (n−) diffusion 20 which does not extend under an edge of floating gate 24. Heavily doped (n+) drain region 16 has been formed such that adjacent lightly doped diffusion 22 does extend under an edge of floating gate 24. Source region 14, as including region 20, and drain region 16, as including regions 22 and 38, are separated by channel region 18, the separation typically may be in the range of 0.6 to 0.8 microns.

Turning next to FIGS. 3a–c, which are a series of steps in a second preferred fabrication method. The initial fabrication process steps are similar to those found in FIGS. 2a and 2b, and therefore, for brevity, their detailed description will not be regarded here.

Turning first to FIG. 3a, lightly doped diffused regions 44 and 46 are formed by an arsenic implant which is directed towards the surfaces of exposed areas 35 and 39 of semiconductor layer 12 at a nearly perpendicular angle, as indicated by the arrows. Regions 44 and 46 may be created, for example, by a phosphorus implant at a dose of $1\times10^{12}$ to $1\times10^{13}$ cm$^{-2}$ and at an energy of approximately 50 to 70 KeV. The use of an implantation beam striking the exposed surfaces of semiconductor layer 12 at a substantially perpendicular angle aligns the edges of diffused regions 44 and 46 with the edges of the stack preventing any extensions under floating gate 24.

Turning next to FIG. 3b, the lightly diffused region 48 is formed adjacent lightly diffused region 46 by a large angle tilt implant of phosphorus. This implant may, for example, be at a dose of $1-2\times10^{13}$ cm$^{-2}$ at an energy of 50 to 70 KeV. The angle may be in the range of 7° to 45° in relation to the surface of semiconductor layer 12. Preferably, the angle of implant will approximate 45°. The large angle tilt implant allows phosphorus ions to become implanted in region 48 which extends underneath floating gate 24. Further, the angle of implant allows the stack to shield source side 35 such that further phosphorus implantation beyond that used to create diffused region 44 is minimized.

Turning next to FIG. 3c, sidewall oxides 43 are again formed by a conventional process. A standard arsenic implant is then directed at an angle nearly perpendicular the surface of semiconductor layer 12 in order to create heavily doped source region 14 and drain region 16. Sidewall insulators 43 function as an implant mask such that heavily doped source region 14 has a lightly doped diffused region 20 which abuts the channel 18 but which does not extend under floating gate 24. Following this step, the drain side of the cell has also reached its final profile, having a heavily doped drain 16 which has an adjacent lightly doped region 22, which does extend under the edge of floating gate 24. Source region 14 and drain region 16 have been created, for example, by a perpendicular arsenic implant at a dose of $5\times10^{13}$ cm$^{-2}$, and at an energy of 50 to 70 KeV.

Figure 4B:
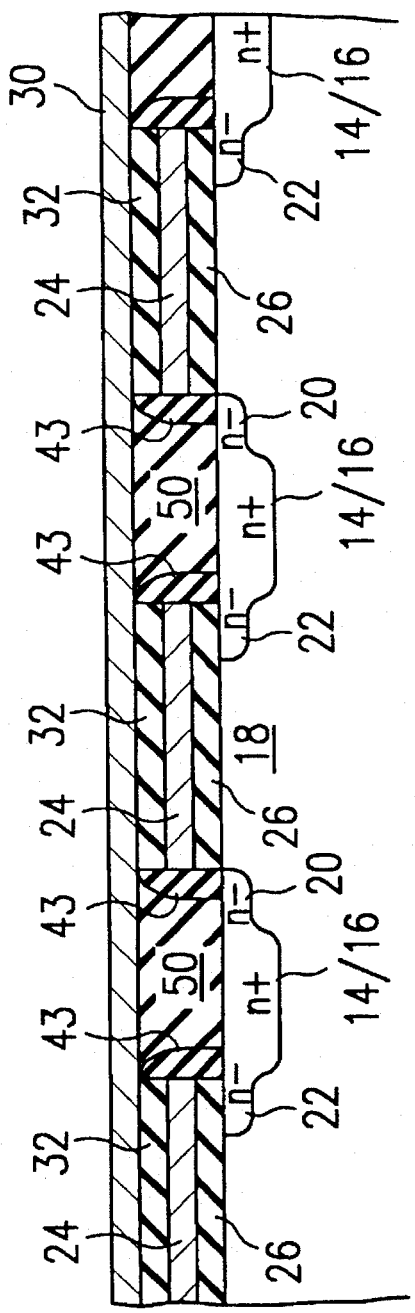
Figure 4C:
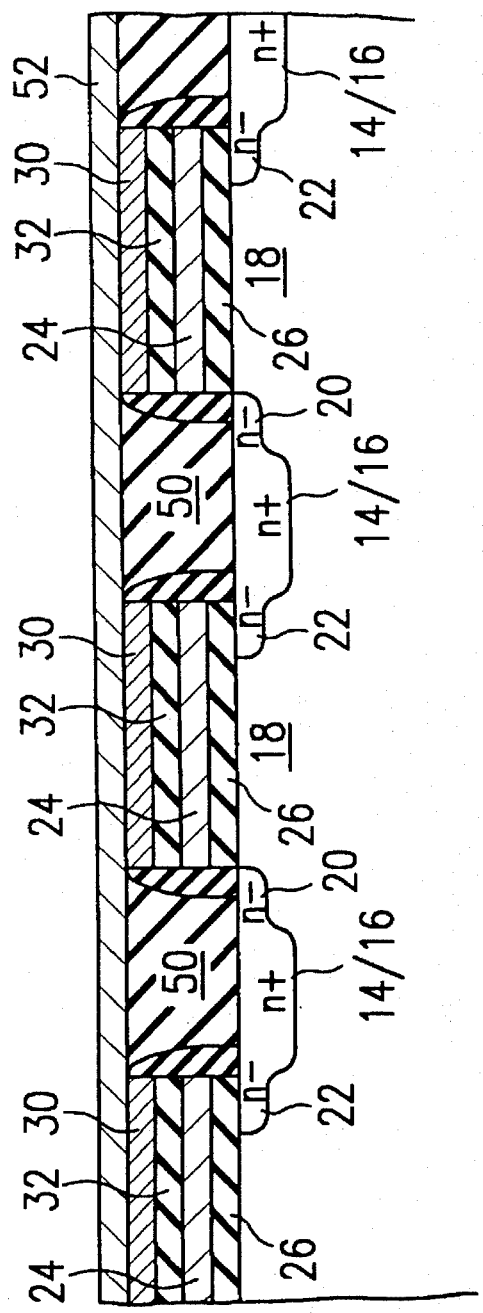

The present invention can be employed in an array of non-volatile memory cells formed in columns 54 and in rows 56 as depicted in FIGS. 4a, 4b and 4c. In the array configuration shown, source regions 14 and drain regions 16 are replaced by source/drain regions 14/16. This term indicates their dual purpose, as a source/drain region 14/16 acts as a drain for a first cell, while acting as a source for an adjacent second cell. Lightly doped diffused regions 20 and 22 are now formed on opposite sides of each heavily doped source/drain region 14/16. Control gates 30 are now elongated and insulatively overlie each of a plurality of floating gates 24 provided for each cell along a corresponding row 56.

As shown in FIG. 4b, a slight variation in the overall structure is required so that the asymmetrical cells according to the invention can be merged into an array format. Specifically, sidewall spacers 43 now extend only from interlevel oxide 32 down to the surface of semiconductor layer 12. This allows the source/drain regions 14/16 to be formed by the diffusion process prior to the formation of the elongated control gates 30, which now must extend across the array without interruption. Further, insulating structures 50 have been added to separate control gates 30 from the underlying source/drain regions 14/16 and to planarize the array.

While the array shown by the cross-sectional view of FIG. 4b uses an integral control gate 30, a so-called "triple poly structure," as shown in FIG. 4c, may also be employed in order to merge the asymmetrical memory cell of the present invention into an array. In the "triple poly structure" the memory cells remain essentially the same as shown in FIG. 1. Only an additional wordline conductor 52 is formed directly adjacent the control gates 30 of the cells in the respective rows in the array. As with the cell depicted in FIG. 1, the cells depicted in FIG. 4c have sidewall insulators 43 which extend from the control gates 30 to the surface of semiconductor layer 12. Formation of source/drain regions 14/16 by a diffusion process can then take place following the formation of respective control gates 30 and before the formation of the wordline conductors 52. Again, isolating structures 50 are provided which separate the wordline conductors 52 from the underlying source/drain diffusion regions 14/16.

The operation of memory cell 10 can now be described in detail. In the write or program mode, during which floating gate 24 is charged with electrons, source region 14 is grounded while drain region 16 has a voltage of approximately 5 volts applied to it. Simultaneously, a voltage of approximately 12 volts is applied to control gate 30 which induces a conductive inversion region between source region 14 and drain region 16. The voltage difference created between source region 14 and drain region 16 causes electron flow from source region 14 to drain region 16, as with a conventional field effect memory device. Unlike conventional devices, however, the pinch-off region normally found adjacent drain region 16 has been substantially reduced or eliminated because lightly doped diffused region 22 has reduced the maximum electric field density in channel 18 near drain 16, thereby minimizing interaction with the electric field across gate oxide 26 due to the voltage applied to control gate 30. Lightly doped diffused region 22 in essence acts like a low resistance region between drain region 16 and channel 18, which causes a voltage drop which spreads out the electric field in the channel. Since the pinch-off region has been essentially eliminated, the concentration of hot electron injection in the small pinch-off area no longer occurs.

At the same time, lightly diffused region 20 creates a resistance between channel 18 and source region 14, causing a channel-to-source voltage drop. All of the remaining voltage created between drain 16 and source 14 is dropped in the area of diffused region 20, resulting in a high electric field. The majority of hot electrons are now created in this high electric field. This essentially moves the electron injection to the source side of the cell. Since the majority of electrons are now being created near the source region, where the electric field across the gate field oxide is at a maximum, the number which will jump the oxide and reach the floating gate will be maximized. Thus, two primary advantages of the present invention have been realized. First, the injection process in the pinch-off region near the drain has been eliminated. Second, full advantage has been obtained from the high electric field across the gate oxide found near the source region.

In addition, during the write operation, a non-selected cell in an array whose drain is pulsed high can sometimes have sufficiently high field to generate enough hot electrons to be injected into the floating gate unintentionally, even though the control gate is not pulsed high. This unintentional write is called bitline-disturb. With the lightly doped region in the drain, the phenomenon can be substantially reduced since the lightly doped region acts to reduce the electric field. Furthermore, during the read operation, the field generated by the application of the read voltage (typically 1.5 V) can gradually generate enough hot electrons which travel to the floating gate during the course of the device lifetime. This condition is widely known as "read-disturb" in the art. By having a lightly doped region in the drain region, the electric field is again reduced, substantially increasing the overall immunity to read-disturb.

During the read operation of memory cell 10, a voltage of approximately five volts is applied to control gate 30 while 0 volts are applied to source region 14 and 1.5 volts are applied to drain region 16. If a logic "one" has been programmed to memory cell 10, i.e. floating gate 24 is not charged, the voltage applied to control gate 30 will exceed the threshold voltage of the cell and current will flow from source region 14 to drain region 16. During the reading operation, the terminal of floating gate 24 will drive the underlying lightly doped diffused region 22 into strong inversion. This allows the further advantage of increasing drive current necessary to read a logic "one" when programmed into memory cell 10.

Thus, the present invention allows for maximum hot electron injection in a non-volatile memory cell from the source side of the channel. At the same time, the substantial elimination of the pinch-off region minimizes the risk of having unwanted hot electrons injection onto the floating gate when any voltage is applied to the drain region. Further, with the electron injection no longer concentrated in a small area, gate oxide degradation is reduced. Finally, by having an extension of the floating gate overlying a lightly doped diffusion region adjacent the drain region, the present invention allows for enhanced drive current during the reading operation.

Although the present invention has been described in detail, it should be understood that various changes, substitutions and alterations can be made herein without departing from the spirit and scope of the invention as defined by the appended claims.

What is claimed is:

1. A method for operating a non-volatile memory cell comprising the steps of:
   providing the non-volatile memory cell, wherein said memory cell comprises:
      heavily doped source and drain regions formed in a layer of semiconductor, said source and drain regions spaced by a channel region;
      a lightly doped source region formed adjacent said heavily doped source region;
      a lightly doped drain region formed adjacent said heavily doped drain region;
      a floating gate conductor insulatively overlying said channel region and insulatively overlying said lightly doped drain region but not substantially overlying said lightly doped source region; and
      a control gate conductor capacitively coupled with said floating gate conductor; and
   programming said non-volatile memory cell by applying a first selected voltage to said control gate, a second selected voltage to said heavily doped source region and a third selected voltage to said heavily doped drain region wherein the application of said selected voltages creates a high electric field adjacent said lightly doped source region thereby injecting electrons from said lightly doped source region onto said floating gate;
   wherein said non-volatile memory cell is further read by applying about five volts to said control gate, applying about zero volts to said heavily doped source region and applying about 1.5 volts to said heavily doped drain region.

2. The method of claim 1 wherein:
   said first selected voltage comprises about 12 volts;
   said second selected voltage comprises about 0 volts; and
   said third selected voltage comprises about 5 volts.

3. The method of claim 1 wherein said non-volatile memory cell is further erased by applying said selected voltages such that electrons travel from said floating gate to said heavily doped drain region.

* * * * *